US008579417B2

(12) United States Patent
Yazaki

(10) Patent No.: US 8,579,417 B2
(45) Date of Patent: Nov. 12, 2013

(54) LIQUID EJECTING HEAD, LIQUID EJECTING APPARATUS, ACTUATOR DEVICE, AND MANUFACTURING METHOD OF LIQUID EJECTING HEAD

(75) Inventor: Shiro Yazaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 272 days.

(21) Appl. No.: 12/621,697

(22) Filed: Nov. 19, 2009

(65) Prior Publication Data

US 2010/0149284 A1 Jun. 17, 2010

(30) Foreign Application Priority Data

Dec. 15, 2008 (JP) ................... 2008-318005

(51) Int. Cl.
*B41J 2/045* (2006.01)
*H01L 41/22* (2013.01)
*H04R 17/00* (2006.01)

(52) U.S. Cl.
USPC .......................................... 347/71; 29/25.35

(58) Field of Classification Search
USPC ................................ 347/68, 70–72
See application file for complete search history.

(56) References Cited

U.S. PATENT DOCUMENTS

| 6,142,614 | A | 11/2000 | Hashizume et al. | |
| 6,494,567 | B2 * | 12/2002 | Murai | 347/71 |
| 7,265,483 | B2 | 9/2007 | Takeda et al. | |
| 7,364,275 | B2 * | 4/2008 | Lim et al. | 347/70 |
| 2002/0180843 | A1 * | 12/2002 | Irie et al. | 347/70 |

FOREIGN PATENT DOCUMENTS

| JP | 10-211701 | 8/1998 |
| JP | 2005-313628 | 11/2005 |
| JP | 2006-245247 | 9/2006 |
| JP | 2007-059817 | 3/2007 |
| JP | 2008-257575 | 10/2008 |

OTHER PUBLICATIONS

Mechanical Properties of Titanium, 2nd Paragraph; Wikepedia Article ~ Platinum, Section titled Properties.*
Wikipedia Article: Platinum Modulus of Rigidity [see common materials table].*
WebElements: Iridium, Young's Modulus and WebElements: Platinum, Young's Modulus.*

* cited by examiner

*Primary Examiner* — Lisa M Solomon
(74) *Attorney, Agent, or Firm* — Workman Nydegger

(57) ABSTRACT

A liquid ejecting head includes: a piezoelectric element having a first electrode provided above a flow path forming substrate in which pressure generation chambers are formed, a piezoelectric body layer provided so as to correspond to each pressure generation chamber, and a second electrode provided above the piezoelectric body layer, wherein the first electrode, which is formed in the region facing the region where the piezoelectric body layer is formed, includes a first electrically-conductive layer, and a second electrically-conductive layer, which is made of a material having a smaller Young's modulus than that of the first electrically-conductive layer and is formed closer to the flow path forming substrate than the first electrically-conductive layer; and the first electrode, which is formed in the region facing the region where the piezoelectric body layer is not formed, has a surface constituted of the second electrically-conductive layer.

1 Claim, 5 Drawing Sheets

LIQUID EJECTING HEAD, LIQUID EJECTING APPARATUS, ACTUATOR DEVICE, AND MANUFACTURING METHOD OF LIQUID EJECTING HEAD

BACKGROUND

1. Technical Field

The present invention relates to an actuator device having a piezoelectric element, a liquid ejecting head and a liquid ejecting apparatus, which are provided with the actuator device and eject liquid droplets from nozzles by the displacement of the piezoelectric element, and a manufacturing method of the liquid ejecting head.

2. Related Art

As a representative example of the liquid ejecting head, an ink jet type recording head which is mounted on an ink jet type recording apparatus can be given. The ink jet type recording head ejects ink from a nozzle which is communicated with a pressure generation chamber, for example, by deforming a vibration plate constituting a portion of the pressure generation chamber by a piezoelectric element, thereby pressurizing ink in the pressure generation chamber. Also, as for such an ink jet type recording head, there are two kinds of the recording head which are put to practical use. One kind uses an actuator device with a longitudinal oscillation mode elongated and contracted the axial direction of the piezoelectric element and one kind uses an actuator device with a flexural oscillation mode.

As the recording head which uses an actuator device with a flexural oscillation mode, there is a recording head having a piezoelectric element which is constituted of a lower electrode film, a piezoelectric body layer formed on the lower electrode film, and an upper electrode film formed on the piezoelectric body layer (for example, JP-A-2006-245247).

Also, such a piezoelectric element is formed, for example, by forming the piezoelectric body layer and the upper electrode film over the entire surface of a substrate in which the lower electrode film is formed, by using film formation technology, and patterning and dividing the piezoelectric body layer and the upper electrode film into a shape corresponding to each pressure generation chamber by using a lithography method.

The actuator device of such a configuration has an advantage that it is possible to arrange the piezoelectric elements with a high density and also a high-speed driving of the piezoelectric element. However, there is a possibility that variation occurs in the displacement characteristic of each piezoelectric element due to variation in the etching end point when patterning the piezoelectric body layer. That is, a portion of the lower electrode film can be also removed when patterning the piezoelectric body layer. However, the removed amount of the lower electrode film is not constant at all portions, and consequently, there is a case where variation occurs in the displacement characteristic of the piezoelectric element. In particular, when the electrode is formed by stacking a plurality of electrically-conductive layers which are different in terms of Young's modulus, if patterning is stopped in the middle of the thickness direction of an electrically-conductive layer having a larger Young's modulus than that of the other electrically-conductive layer, variation in the thickness is apt to influence the driving of the piezoelectric body layer. Further, if the above-mentioned variation exists in a place where is relatively close to the piezoelectric body layer even in a region where the piezoelectric body layer is not formed, it has been found that it influences the driving of the piezoelectric body layer.

Also, such a problem similarly exists in a liquid ejecting head which ejects liquid droplets other than ink, as well as the ink jet type recording head which ejects ink droplets.

SUMMARY

An advantage of some aspects of the invention is that it provides a liquid ejecting head, a liquid ejecting apparatus, and an actuator device, which can suppress variation in the displacement characteristic of a piezoelectric element, and a manufacturing method of the liquid ejecting head.

According to a first aspect of the invention, there is provided a liquid ejecting head including: a piezoelectric element having a first electrode provided above a flow path forming substrate in which pressure generation chambers are formed, a piezoelectric body layer provided so as to correspond to each pressure generation chamber, and a second electrode provided above the piezoelectric body layer, wherein the first electrode, which is formed in the region facing the region where the piezoelectric body layer is formed, includes a first electrically-conductive layer, and a second electrically-conductive layer, which is made of a material having a smaller Young's modulus than that of the first electrically-conductive layer and is formed closer to the flow path forming substrate than the first electrically-conductive layer; and the first electrode, which is formed in the region facing the region where the piezoelectric body layer is not formed, has a surface constituted of the second electrically-conductive layer.

In such an invention, the displacement characteristic of the piezoelectric element is improved, and also variation in the displacement characteristic of each piezoelectric element is suppressed. Accordingly, a liquid ejecting head with improved liquid droplet ejecting characteristics can be realized.

Further, it is preferable that the thickness of the second electrically-conductive layer is thicker than the thickness of the first electrically-conductive layer. Therefore, the control of the film thickness of the first electrode becomes easier.

Further, as a material for the second electrically-conductive layer, for example, platinum can be given. Further, as a material for the first electrically-conductive layer, for example, iridium can be given.

Further, according to a second aspect of the invention, there is provided a liquid ejecting apparatus including the liquid ejecting head according to the first aspect. In such an invention, a liquid ejecting apparatus with improved liquid droplet ejecting characteristics can be realized.

Further, according to a third aspect of the invention, there is provided an actuator device including: a piezoelectric element having a first electrode provided above a substrate, a piezoelectric body layer provided above the first electrode, and a second electrode provided above the piezoelectric body layer, wherein the first electrode, which is formed in the region facing the region where the piezoelectric body layer is formed, includes a first electrically-conductive layer, and a second electrically-conductive layer which is made of a material having a smaller Young's modulus than that of the first electrically-conductive layer and is formed closer to the flow path forming substrate than the first electrically-conductive layer; and the first electrode, which is formed in the region facing the region where the piezoelectric body layer is not formed, has a surface constituted of the second electrically-conductive layer.

In such an invention, the displacement characteristic of the piezoelectric element is improved, and also variation in the displacement characteristic of each piezoelectric element can be suppressed.

Further, according to a fourth aspect of the invention, there is provided a method of manufacturing a liquid ejecting head including a piezoelectric element having a first electrode provided above a flow path forming substrate, a piezoelectric body layer provided so as to correspond to each pressure generation chamber, and a second electrode provided above the piezoelectric body layer, wherein the first electrode, which is formed in the region facing the region where the piezoelectric body layer is formed, includes a first electrically-conductive layer, and a second electrically-conductive layer which is made of a material having a smaller Young's modulus than that of the first electrically-conductive layer and is formed closer to the flow path forming substrate than the first electrically-conductive layer, the method including: forming the first electrode above the flow path forming substrate; and forming the piezoelectric element by forming the piezoelectric body layer and the second electrode above the first electrode and patterning the piezoelectric body layer and the second electrode, wherein in the step of forming the piezoelectric element, the first electrode is removed up to a portion in the thickness direction of the second electrically-conductive layer along with the patterning of the piezoelectric body layer.

In such an invention, the thickness of the first electrode can be controlled relatively easily and with high precision. Accordingly, the liquid ejecting head having the improved displacement characteristic of the piezoelectric element can be manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be explained in detail on the basis of embodiments.

Figure 1:
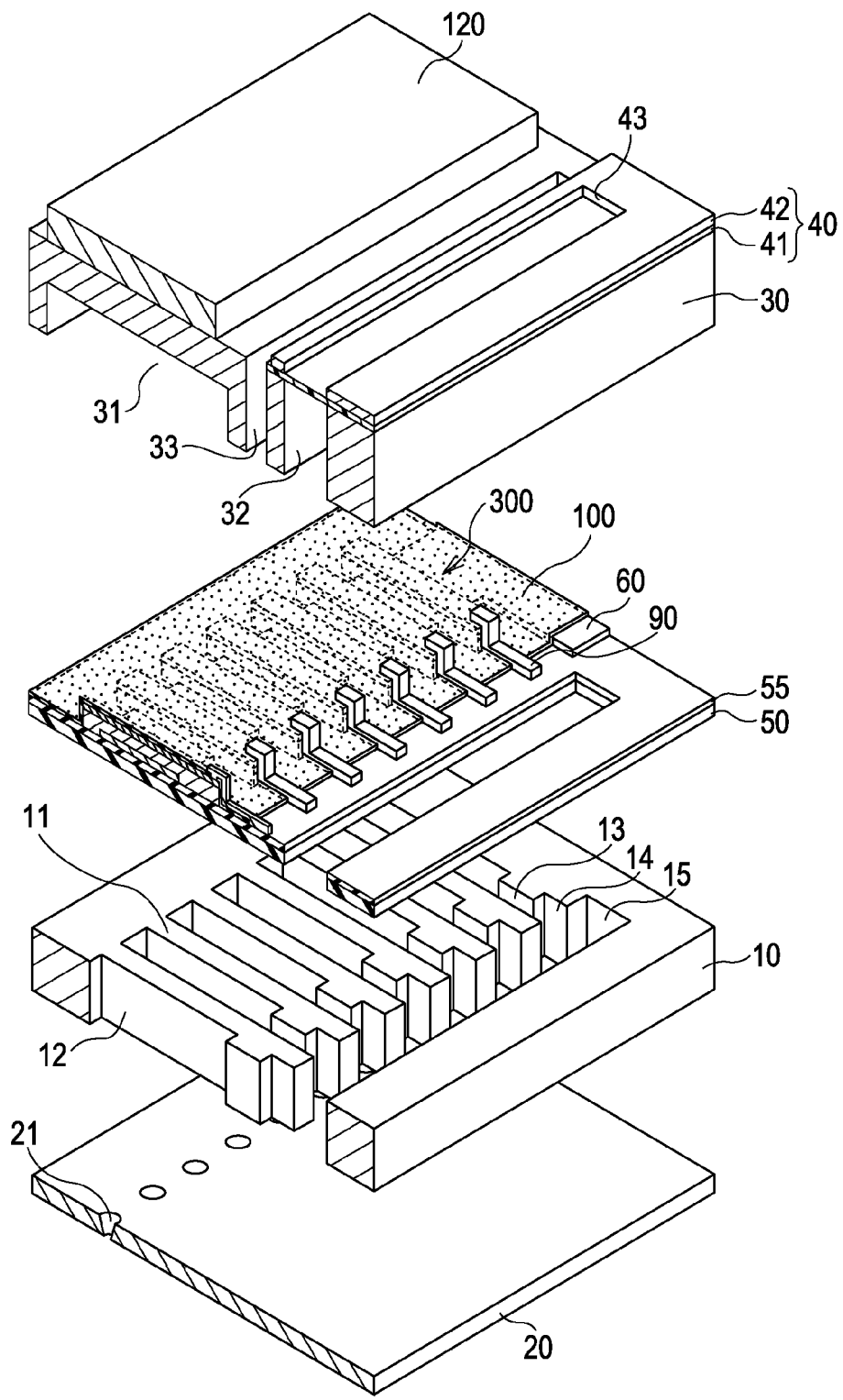
FIG. 1 is a perspective view showing a breakdown of the general configuration of a recording head related to an embodiment.
Figure 2:
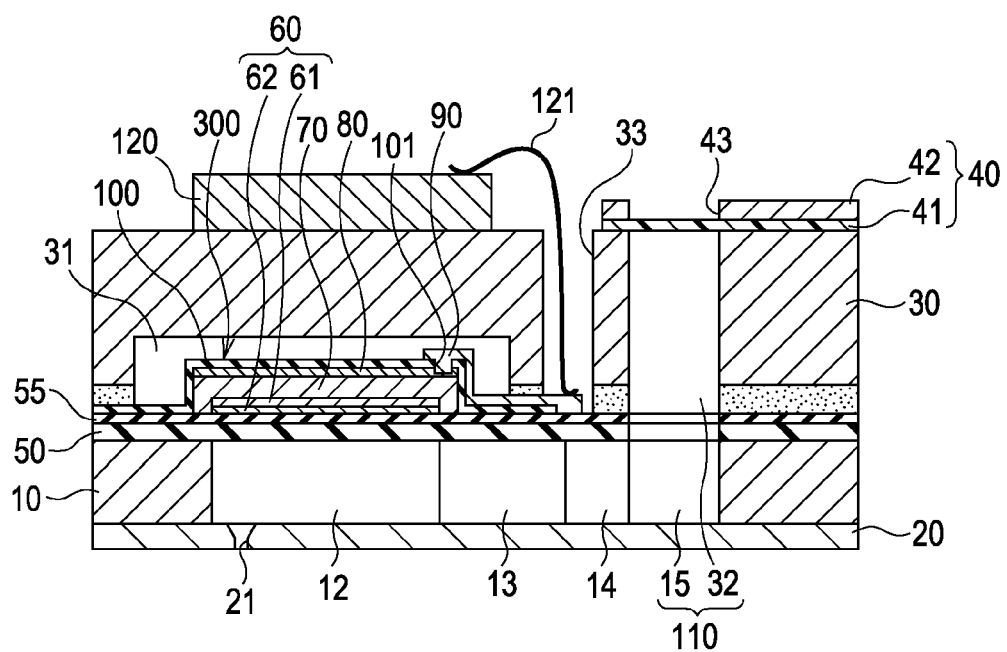
FIG. 2 is a cross-sectional view of the recording head related to the embodiment.
Figure 3:
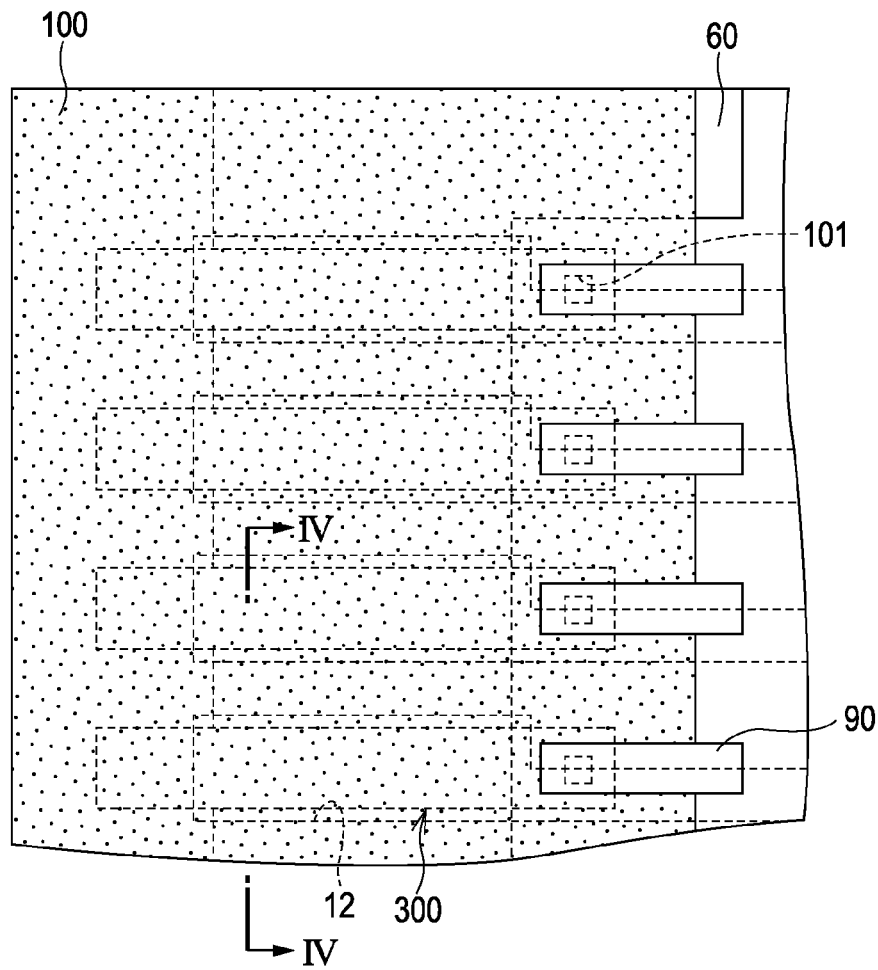
FIG. 3 is a plan view showing a piezoelectric element portion of the recording head related to the embodiment.
Figure 4:
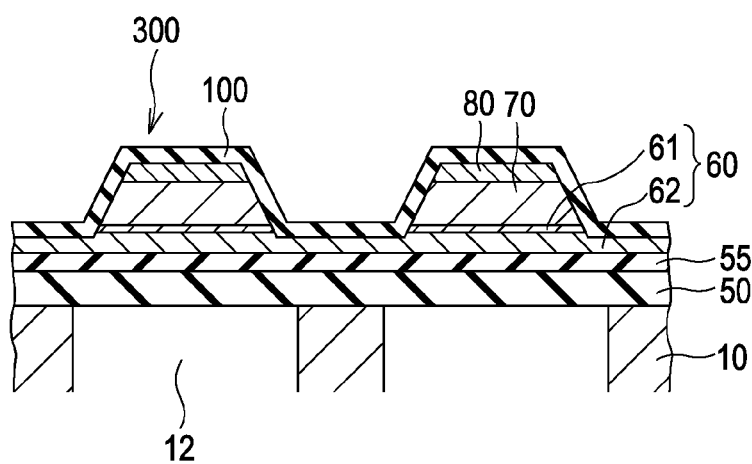
FIG. 4 is a cross-sectional view showing the piezoelectric element portion of the recording head related to the embodiment.

FIG. 1 is a perspective view showing a breakdown of the general configuration of an ink jet type recording head which is a liquid ejecting head related to one embodiment of the invention, and FIG. 2 is a cross-sectional view thereof. Further, FIG. 3 is a plan view showing the configuration of a piezoelectric element, and FIG. 4 is a cross-sectional view taken along line IV-IV of FIG. 3.

As shown in the drawings, a flow path forming substrate 10 is made of a silicon single crystal substrate having a crystal face orientation of (110) in this embodiment, and on one side surface thereof, an elastic film 50 made of an oxide film is formed. In the flow path forming substrate 10, a plurality of pressure generation chambers 12 partitioned by partition walls 11 are disposed in parallel in the width direction (short side direction) of the substrate, and one side face of each pressure generation chamber 12 is constituted by the elastic film 50.

In the flow path forming substrate 10, an ink supply path 13 and a communicating path 14, which are defined by the partition walls 11 and communicated with each pressure generation chamber 12, are provided on one end side in the longitudinal direction of each pressure generation chamber 12. A communicating portion 15 communicated with each communicating path 14 is provided outside the communicating path 14. The communicating portion 15 is communicated with a reservoir portion 32 of a protective substrate 30 described later, thereby constituting a portion of a reservoir 110 which serves as a common ink chamber to the pressure generation chambers 12. Further, each communicating path 14 is formed by extending the partition walls 11 on both sides in the width direction of the pressure generation chamber 12 toward the communicating portion 15 so as to define a space between the ink supply path 13 and the communicating portion 15.

Also, as for a material for the flow path forming substrate 10, although the silicon single crystal substrate is used in this embodiment, the material is, of course, not limited to this, but, for example, glass ceramics, stainless steel, or the like may also be used.

A nozzle plate 20, in which nozzles 21 each communicated with the end portion on the opposite side to the ink supply path 13, of each pressure generation chamber 12 are perforated, is fixed and attached on the opening face side of the flow path forming substrate 10 by an adhesive agent, a hot-melt film, or the like. A material for the nozzle plate 20 is not particularly limited, but it is preferable to use, for example, glass ceramics, silicon single crystal substrate, stainless steel, or the like.

On the other hand, the elastic film 50 is formed on the face on the opposite side to the opening face of the flow path forming substrate 10, as described above, and an insulator film 55 made of an oxide film which is a different material from the elastic film 50 is formed on the elastic film 50. Further, on the insulator film 55, piezoelectric elements 300 are formed. That is, the piezoelectric elements 300 are formed above the flow path forming substrate 10.

The piezoelectric element 300 is constituted of a lower electrode film 60 which is a first electrode, a piezoelectric body layer 70, and a upper electrode film 80 which is a second electrode. The piezoelectric element 300 is not limited to the portion having the lower electrode film 60, the piezoelectric body layer 70, and the upper electrode film 80, but should also include a portion having at least the piezoelectric body layer 70. In general, any one side electrode of the piezoelectric element 300 is made to be a common electrode, and the other side electrode and the piezoelectric body layer 70 are patterned together for every pressure generation chamber 12, thereby constituting an individual electrode. Also, as long as the piezoelectric element 300 can function, another layer may also be provided between the lower electrode film 60 and the piezoelectric body layer 70 or between the piezoelectric body layer 70 and the upper electrode film 80.

Also, here, the piezoelectric element 300 and a vibration plate which is displaced by the driving of the piezoelectric element 300 are collectively called an actuator device. Also, in the example described above, the elastic film 50 and the insulator film 55 serve as the vibration plate. Of course, the configuration of the vibration plate is not particularly limited, but the vibration plate may also include a film other than the elastic film 50 and the insulator film 55. Also, the lower electrode film 60 or the piezoelectric element 300 itself may also substantially double as the vibration plate. In such a case, even if there is no vibration plate as a separate member from the piezoelectric element 300, it serves as the actuator device.

Here, the configuration of the piezoelectric element 300 is explained in more detail. As shown in FIG. 3, in this embodiment, the lower electrode film 60 is formed within the region facing the pressure generation chamber 12 in the longitudinal direction of the pressure generation chamber 12, and continuously provided over the regions corresponding to a plurality of pressure generation chambers 12 in the width direction (short side direction) of the pressure generation chamber 12. Also, the piezoelectric body layer 70 and the upper electrode film 80 are provided within the region facing the pressure generation chamber 12 in the width direction of the pressure generation chamber 12, and provided to extend up to the region outside the lower electrode film 60 (in this embodiment, outside the pressure generation chamber 12) in the longitudinal direction of the pressure generation chamber 12.

Further, the piezoelectric element 300 is covered by a covering film 100. In this embodiment, the covering film 100 is continuously provided over the region facing all piezoelectric elements 300. In this manner, the piezoelectric element 300 is covered by the covering film 100, so that the breaking of the piezoelectric element 300 due to moisture in the air, or the like can be suppressed. Further, an exposure hole which exposes the upper electrode film 80 constituting the piezoelectric element 300 may also be provided in the covering film 100. By providing such an exposure hole, the lowering of the amount of displacement of the piezoelectric element 300 can be suppressed.

As a material for the covering film 100, it is good if it is a material having moisture resistance, and, for example, an inorganic insulating material such as silicon oxide ($SiO_x$), tantalum oxide ($TaO_x$), or aluminum oxide ($AlO_x$) can be given. In particular, an inorganic amorphous material is preferable. On the covering film 100, a lead electrode 90 made of, for example, gold (Au) or the like is formed, and the lead electrode 90 is connected to the upper electrode film 80 through a contact hole 101 formed in the covering film 100.

Further, the lower electrode film 60 formed above the flow path forming substrate 10 includes a first electrically-conductive layer 61 and a second electrically-conductive layer 62 formed of a material having a smaller Young's modulus than that of the first electrically-conductive layer 61. That is, the lower electrode film 60 is constituted of a plurality of electrically-conductive layers formed of materials which are different in terms of Young's modulus. As shown in FIG. 4, in this embodiment, the lower electrode film 60 in the region facing the region where the piezoelectric body layer 70 is formed is constituted of two layers of the first electrically-conductive layer 61 and the second electrically-conductive layer 62, and the layers are formed in order of the second electrically-conductive layer 62 and the first electrically-conductive layer 61 from the insulator film 55. Further, the second electrically-conductive layer 62 is formed to be thicker than the first electrically-conductive layer 61. The thickness of the second electrically-conductive layer 62 is, for example, approximately ¾ of the thickness of the lower electrode film 60.

As a material for the first electrically-conductive layer 61, it is preferable to use iridium (Ir: Young's modulus 529 [GPa]), osmium (Os: Young's modulus 550 [GPa]), ruthenium (Ru: Young's modulus 414 [GPa]), rhodium (Rh: Young's modulus 359 [GPa]), or the like. For example, in this embodiment, the first electrically-conductive layer 61 is formed of iridium oxide ($IrO_x$). These metals have the function of preventing the constituents composing the piezoelectric body layer from diffusing into the lower electrode film 60 when the piezoelectric body layer 70 is fired from a precursor into a crystalline body at high temperatures. Accordingly, it is necessary that the first electrically-conductive layer 61 is formed in the region where the piezoelectric body layer 70 is formed.

On the other hand, as a material for the second electrically-conductive layer 62, it is preferable to use platinum (Pt: Young's modulus 116 [GPa]). Of course, a material for the second electrically-conductive layer 62 is not to be particularly limited, provided that it is a material having a smaller Young's modulus than that of a material for the first electrically-conductive layer 61. The second electrically-conductive layer 62 is higher in electrical conductivity than the first electrically-conductive layer 61 and hardly loses its electrical conductivity even in heat treatment for converting the piezoelectric body layer 70 from a precursor into a crystalline body. Also, if the lower electrode film 60 is constituted of only the first electrically-conductive layer 61, at least a portion of the first electrically-conductive layer 61 is oxidized in the above-mentioned heat treatment, so that there is a possibility that electrical conductivity will not be secured. Accordingly, the second electrically-conductive layer 62 is formed in order to secure electrical conductivity.

Further, the lower electrode film 60 constituted of such first and second electrically-conductive layers 61 and 62 is removed up to a portion of the second electrically-conductive layer 62 along with the piezoelectric body layer 70 when the piezoelectric element 300 is formed. That is, the surface of the lower electrode film 60, which is in the region facing the region where the piezoelectric body layer 70 is removed and thus not formed, is constituted of the second electrically-conductive layer 62 (refers to FIG. 4).

In this manner, a portion of the lower electrode film 60 is removed, so that the displacement characteristic of the piezoelectric element 300 improves. Also, since the vibration plate can be easily deformed, the displacement characteristic of the vibration plate involved in the driving of the piezoelectric element 300 is improved. In particular, in this embodiment, since in the portion other than the piezoelectric element 300, the first electrically-conductive layer 61 made of iridium having a large Young's modulus has been entirely removed, the vibration plate is easily deformed, so that the displacement characteristic of the vibration plate involved in the driving of the piezoelectric element 300 is also improved.

Although the details will be described later, in a more preferable aspect, due to the fact that the lower electrode film 60 is removed up to a portion of the second electrically-conductive layer 62, it is possible to make the displacement characteristic of the vibration plate involved in the driving of the piezoelectric element 300 uniform. That is, variation in the amount of displacement of the vibration plate involved in the driving of each piezoelectric element 300 can be suppressed. Therefore, an ink jet type recording head with improved print quality can be realized.

That is, since the lower electrode film 60 has been removed up to a portion of the second electrically-conductive layer 62, the first electrically-conductive layer 61 does not partially remain and the occurrence of cracks due to stress concentration can also be suppressed. Incidentally, if the first electrically-conductive layer 61 partially remains, the rigidity of the portion locally increases, so that cracks due to stress concentration can be easily generated in the portion. If the removing process of the first electrically-conductive layer 61 is stopped at the boundary portion between the first electrically-conductive layer 61 and the second electrically-conductive layer 62, there is a possibility that the first electrically-conductive layer 61 remains as a residue on the surface of the second electrically-conductive layer 62. The influence on each piezoelectric element 300 is different according to the portion where there are remains of the first electrically-conductive layer 61 in the region facing the region where the piezoelectric body layer 70 is not formed. Even if the size of the region where there are remains of the rigid first electrically-conductive layer 61 differs according to location, the influence on each piezoelectric element 300 is different. Since the influence of the remains of the first electrically-conductive layer 61 is different in this manner, there is variation in the amount of displacement by the driving of each piezoelectric element 300. Accordingly, by removing the lower electrode film 60 up to a portion in the thickness direction of the second electrically-conductive layer 62, the above-mentioned harmful effect, due to the fact that the first electrically-conductive layer 61 partially remains, can be avoided.

Also, in this embodiment, each of the first electrically-conductive layer 61 and the second electrically-conductive layer 62, which constitute the lower electrode film 60 is a separate layer, and the boundary between these first and second electrically-conductive layers 61 and 62 definitely exists. However, the boundary between the first electrically-conductive layer 61 and the second electrically-conductive layer 62 may not definitely exist. Also in such a case, due to the fact that the lower electrode film 60 is removed up to a portion in the thickness direction of the second electrically-conductive layer 62, so that the surface of the lower electrode film 60 is constituted of the second electrically-conductive layer 62, the effect as described above can be obtained.

Also, in this embodiment, the second electrically-conductive layer 62 made of platinum has tensile stress which is an internal stress, and the first electrically-conductive layer 61 made of iridium oxide has compressive stress. Therefore, according to a difference in the directions of these internal stresses, interlayer peeling can possibly occur between the first and second electrically-conductive layers 61 and 62. However, since the covering film 100 which covers the piezoelectric element 300 is provided as described above, the occurrence of such interlayer peeling can also be suppressed.

Hereinafter, one example of the manufacturing method of the piezoelectric element section in the ink jet type recording head of this embodiment will be explained with reference to FIGS. 5A to 5C. Incidentally, FIGS. 5A to 5C are cross-sectional views in the width direction of the pressure generation chamber of the ink jet type recording head.

Figure 5A:
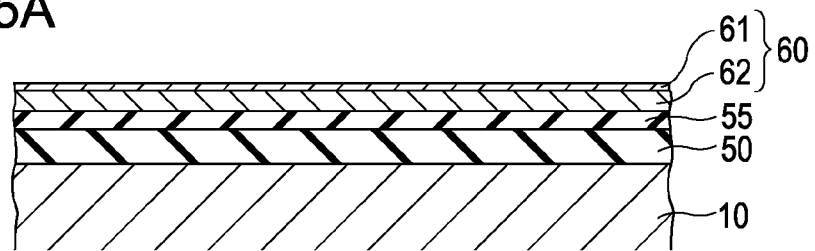
FIGS. 5A to 5C are cross-sectional views showing the manufacturing method of the recording head related to the embodiment.

As shown in FIG. 5A, first, the lower electrode film 60 is formed on the insulator film 55 constituting the vibration plate. That is, the second electrically-conductive layer 62 is formed by depositing platinum (Pt) on the insulator film 55 by a sputtering method or the like, and then the first electrically-conductive layer 61 made of iridium oxide ($IrO_x$) is formed on the second electrically-conductive layer 62 by a sputtering method or the like. Further, these first and second electrically-conductive layers 61 and 62 are patterned into a given shape (refer to FIG. 3).

Figure 5B:
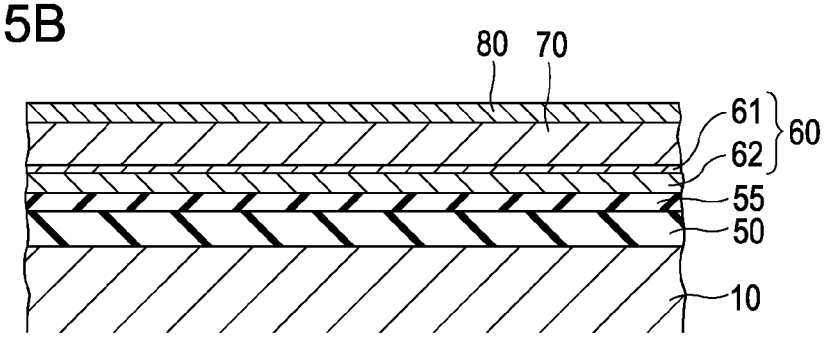

Next, as shown in FIG. 5B, the piezoelectric body layer 70 made of, for example, lead zirconate titanate (PZT) or the like is formed over the lower electrode film 60 and the insulator film 55. The forming method of the piezoelectric body layer 70 is not particularly limited, but, for example, a so-called sol-gel method, a MOD method, a sputtering method, or the like can be given. Then, the upper electrode film 80 is formed on the piezoelectric body layer 70. As a material for the upper electrode film 80, a material being relatively high in electrical conductivity is suitable, and, for example, it is preferable to use a metal material such as iridium, platinum, or palladium.

Figure 5C:
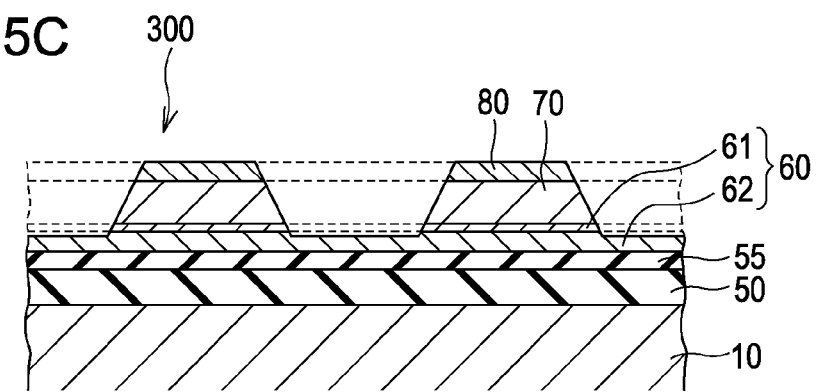

Subsequently, as shown in FIG. 5C, by patterning the upper electrode film 80 and the piezoelectric body layer 70 into a given shape, the piezoelectric element 300 is formed. At this time, it is difficult to only pattern the upper electrode film 80 and the piezoelectric body layer 70, and a portion in the thickness direction of the lower electrode film 60 is also removed along with the upper electrode film 80 and the piezoelectric body layer 70. In the invention, the lower electrode film 60 is removed up to a portion in the thickness direction of the second electrically-conductive layer 62 by controlling the amount of the etching of the lower electrode film 60 at this time. That is, the etching of the lower electrode film 60 is completed within the second electrically-conductive layer 62.

In the configuration of this embodiment, since the second electrically-conductive layer 62, the first electrically-conductive layer 61, and the piezoelectric body layer 70 are stacked in this order from the insulator film 55 side, the etching of the lower electrode film 60 is completed at the point in time when a portion in the thickness direction of the second electrically-conductive layer 62 has been removed after the piezoelectric body layer 70 and the first electrically-conductive layer 61 were completely removed.

In this manner, by completing the etching of the lower electrode film 60 at the point in time when the lower electrode film 60 has been removed up to a portion in the thickness direction of the second electrically-conductive layer 62, the displacement characteristic of the vibration plate involved in the driving of the piezoelectric element 300 can be made to be uniform. As described above, since the second electrically-conductive layer 62 is formed of a material having a smaller Young's modulus than that of the first electrically-conductive layer 61, the amount of the etching of the second electrically-conductive layer 62 can be controlled more easily than the amount of the etching of the first electrically-conductive layer 61 and with high precision. In particular, in this embodiment, since the second electrically-conductive layer 62 is formed thicker than the first electrically-conductive layer 61, it is possible to complete the etching within the second electrically-conductive layer 62.

Therefore, the displacement characteristic of the vibration plate involved in the driving of the piezoelectric element 300 can be made to be uniform, and an ink jet type recording head with the improved print quality can be realized.

Also, the protective substrate 30 having a piezoelectric element retention portion 31 is joined on the flow path forming substrate 10 in which such piezoelectric elements 300 are formed. The piezoelectric element retention portion 31 is configured so as to be able to suppress air getting into the interior thereof, but does not need to be necessarily sealed. Also, the piezoelectric element 300 is accommodated inside the piezoelectric element retention portion 31, so that it is protected in a state in which it is hardly influenced by the external environment.

Further, in the protective substrate 30, the reservoir portion 32 is provided in the region facing the communication portion 15, and the reservoir portion 32 is communicated with the communication portion 15 of the flow path forming substrate 10, as described above, thereby constituting the reservoir 110 which serves as a common ink chamber to the pressure generation chambers 12. Also, in the region between the piezoelectric element retention portion 31 and the reservoir portion 32 in the protective substrate 30, a through-hole 33 which penetrates the protective substrate 30 in the thickness direction is provided, and a portion of the lower electrode film 60 and a leading end portion of the lead electrode 90 are exposed in the through-hole 33.

Further, on the protective substrate 30, a driving circuit 120 for driving the piezoelectric elements 300 is fixed. Also, the driving circuit 120 and the lead electrodes 90 are connected to each other by connection wirings 121 which are made of an electrically-conductive wire such as a bonding wire.

Also, as for the protective substrate 30, it is preferable to use a material having approximately the same coefficient of thermal expansion as that of the flow path forming substrate 10, for example, glass, ceramic material, or the like, and in this embodiment, the protective substrate 30 was formed using a silicon single crystal substrate which is the same material as that of the flow path forming substrate 10.

Also, a compliance substrate 40 constituted of a sealing film 41 and a fixing plate 42 is joined to the protective substrate 30. Here, the sealing film 41 is made of a material having flexibility and low rigidity, and one side face of the reservoir portion 32 is sealed by the sealing film 41. Also, the fixing plate 42 is formed of a hard material such as a metal. Since the region of the fixing plate 42 facing the reservoir 110 is formed as an opening portion 43 in which the fixing plate was completely removed in the thickness direction, one side face of the reservoir 110 is sealed by only the sealing film 41 which is flexible.

In the ink jet type recording head of this embodiment, ink is introduced from an external ink supply means (not shown), and the internal portion extending from the reservoir 110 to the nozzle 21 is filled with ink. Thereafter, according to a recording signal from the driving circuit 120, voltage is applied to each piezoelectric element 300 corresponding to the pressure generation chamber 12, so that the piezoelectric element 300 is flexed and deformed, whereby the pressure in each pressure generation chamber 12 increases, and consequently ink droplets are ejected from the nozzle 21.

Other Embodiments

Although an embodiment of the invention has been described above, the invention is not to be limited to the above-described embodiment. For example, in the above-described embodiment, an example in which the lower electrode film 60 is constituted of only the first and second electrically-conductive layers 61 and 62 was described. However, the configuration of the lower electrode film 60 is not to be limited to this. For example, the lower electrode film 60 may further include a third electrically-conductive layer in addition to the first and second electrically-conductive layers 61 and 62. Specifically, the third electrically-conductive layer or the like provided between the insulator film 55 and the second electrically-conductive layer 62 and made of, for example, titanium oxide ($TiO_x$) or the like may also be included in the lower electrode film 60.

Figure 6:
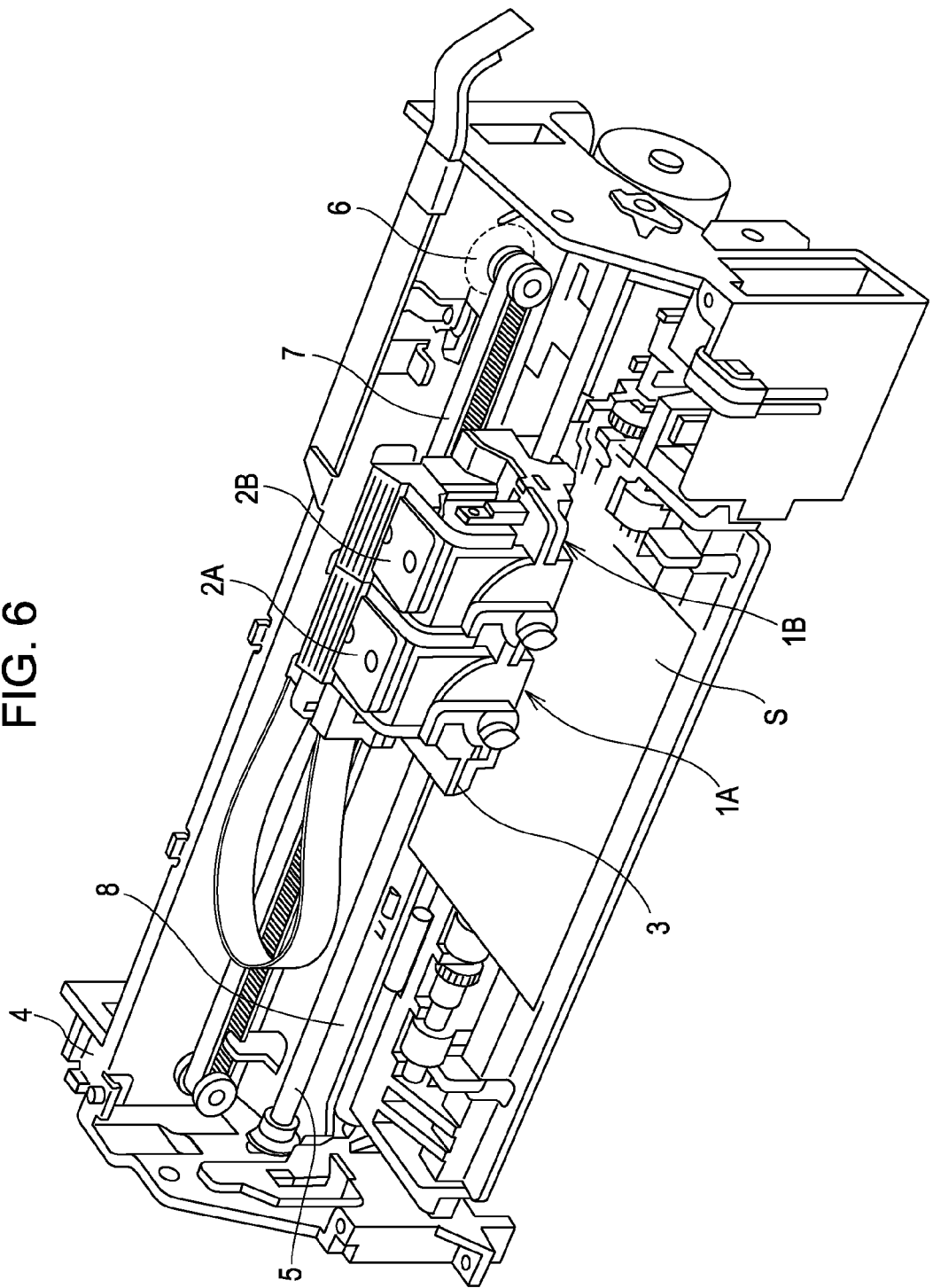
FIG. 6 is a schematic view of an ink jet type recording apparatus related to one embodiment of the invention.

Further, the ink jet type recording head of each embodiment constitutes a portion of a recording head unit having an ink flow path which is communicated with an ink cartridge and the like, and is mounted on an ink jet type recording apparatus. FIG. 6 is a schematic view showing one example of the ink jet type recording apparatus.

As shown in FIG. 6, on recording head units 1A and 1B having the ink jet type recording heads, cartridges 2A and 2B constituting ink supply means are detachably mounted, and a carriage 3 on which the recording head units 1A and 1B are mounted is provided to be movable in an axial direction on a carriage shaft 5 attached to an apparatus main body 4. The recording head units 1A and 1B respectively discharge, for example, a black ink composition and a color ink composition.

Further, the carriage 3 on which the recording head units 1A and 1B are mounted is moved along the carriage shaft 5 by the driving force of a drive motor 6, which is transmitted to the carriage 3 through a plurality of gears (not shown) and a timing belt 7. On the other hand, a platen 8 is provided along the carriage shaft 5 in the apparatus main body 4, and a recording sheet S, which is a recording medium such as paper and is fed by a paper feed roller (not shown) or the like, is wound around the platen 8 and transported. This ink jet type recording apparatus is only one example of the liquid ejecting apparatus.

Also, although in the above-described embodiment, the ink jet type recording head has been used and described as an example of the liquid ejecting head, the invention broadly targets liquid ejecting heads in general and, of course, is also applicable to the liquid ejecting head which ejects liquid other than ink. As other liquid ejecting heads, for example, various recording heads used in an image recording apparatus such as a printer, a color material ejecting head used for the manufacturing of a color filter of a liquid crystal display or the like, an electrode material ejecting head used for the formation of the electrode of an organic EL (electroluminescence) display, a FED (Field Emission Display), or the like, a biological organic matter ejecting head used for the manufacturing of a bio-chip, and the like can be given.

Further, the invention can be applied to not only the actuator devices which are mounted on such a liquid ejecting head (the ink jet type recording head), but also to actuator devices which are mounted on various apparatuses. The actuator device of the invention can also be applied to, for example, a sensor and the like other than the above-mentioned heads.

What is claimed is:

1. A method of manufacturing a liquid ejecting head including a piezoelectric element having a first electrode provided above a flow path forming substrate, a piezoelectric body layer provided so as to correspond to each pressure generation chamber, and a second electrode provided above the piezoelectric body layer, wherein the first electrode, which is formed in the region facing the region where the piezoelectric body layer is formed, includes a first electrically-conductive layer; and a second electrically-conductive layer, which is made of a material having a smaller Young's modulus than that of the first electrically-conductive layer and is formed closer to the flow path forming substrate than the first electrically-conductive layer, the method comprising:
  forming the first electrode above the flow path forming substrate; and
  forming the piezoelectric element by forming the piezoelectric body layer and the second electrode above the first electrode and patterning the piezoelectric body layer and the second electrode,
  wherein in the step of forming the piezoelectric element, the first electrode is removed up to a portion in the thickness direction of the second electrically-conductive layer along with the patterning of the piezoelectric body layer.

* * * * *